United States Patent [19]
Matsui

[11] Patent Number: 5,298,850
[45] Date of Patent: Mar. 29, 1994

[54] CHARGE INDICATOR OF BATTERY

[75] Inventor: Tomoki Matsui, Kyoto, Japan

[73] Assignee: Yuasa Battery Company Limited, Takatsuki, Japan

[21] Appl. No.: 47,061

[22] Filed: Apr. 16, 1993

Related U.S. Application Data

[63] Continuation of Ser. No. 853,065, Mar. 17, 1992, abandoned.

[30] Foreign Application Priority Data

Mar. 29, 1991 [JP] Japan ................. 3-093167

[51] Int. Cl.⁵ ............... H02J 7/00; G01N 27/416
[52] U.S. Cl. ..................... 320/48; 324/428
[58] Field of Search .............. 320/48, 43, 44; 324/428, 433, 426, 435; 340/636

[56] References Cited

U.S. PATENT DOCUMENTS

| | | | |
|---|---|---|---|
| 4,193,026 | 3/1980 | Finger et al. | 324/428 |
| 4,258,306 | 3/1981 | Bourke et al. | 320/48 |
| 4,388,618 | 6/1983 | Finger | 340/636 |
| 4,560,937 | 12/1985 | Finger | 324/433 |
| 4,740,754 | 4/1988 | Finger | 324/428 |

Primary Examiner—Steven L. Stephan
Assistant Examiner—Robert Nappi
Attorney, Agent, or Firm—Watson, Cole, Grindle & Watson

[57] ABSTRACT

A charge indicator for a battery functioning to accurately indicate the residual capacity corresponding to changes of the discharge rate of the battery uses a timer output voltage of a timer circuit and is changed corresponding to the discharge rate of the battery by a pulse-period-setting part. The timer output voltage and the voltage corresponding to the residual capacity are differentially amplified in the corresponding voltage of the discharge rate-varying part to change the corresponding voltage of the discharge rate. When the sensed voltage exceeds a predetermined value, the reset part resets the voltage to a corresponding voltage of the fully charged battery.

2 Claims, 1 Drawing Sheet

CHARGE INDICATOR OF BATTERY

This application is a continuation of application Ser. No. 853,065, filed 17 Mar. 1992 now abandoned.

BACKGROUND OF THE INVENTION

1. Field of the Invention

The present invention relates to a charge indicator of a battery.

2. Description of the Related Art

As a charge indicator of a battery used for electric vehicles such as an electric car and a forklift and for electronic devices, ones implemented by a method of measuring discharged ampere-hour of the battery, by a method of measuring a terminal voltage of the battery during discharge and by a method of measuring specific gravity of electrolyte of the battery are known.

Among the aforementioned methods utilized for the charge indicator, the method of measuring the discharged ampere-hour of the battery has such a problem that actual residual capacity fluctuates depending on discharge rate of the battery. The method of measuring the terminal voltage of the battery during discharge also has such a problem that a conversion circuit has to be provided to indicate the terminal voltage by discharging a constant set current. Furthermore, the method of measuring the specific gravity of electrolyte of the battery has such a problem that a high-precision specific gravity meter has to be used. Accordingly, it is an object of the present invention to solve the aforementioned problems by providing a charge indicator of a battery which can indicate residual capacity corresponding to discharge rate of the battery.

SUMMARY OF THE INVENTION

In order to attain the aforementioned goal, according to the present invention, a charge indicator of a battery is comprised of:

a pulse period setting part for comparing a sensed voltage that corresponds to a terminal voltage of the battery with a corresponding voltage of discharge rate that corresponds to a discharge rate of the battery and for outputting a pulse period varying signal;

a timer part for inputting the pulse period varying signal to change pulse periods and for outputting a signal with a discharge time that corresponds to the discharge rate;

a corresponding voltage of discharge rate varying part for differentially amplifying a timer output voltage that corresponds to the output signal of the timer part and a corresponding voltage of residual capacity that corresponds to a residual capacity of the battery to change the corresponding voltage of discharge rate corresponding to the discharge rate of the battery; and a reset part for sending out a reset signal to the timer part to reset the corresponding voltage of discharge rate to a corresponding voltage of full charge when the sensed voltage exceeds a predetermined value.

According to the present invention, the timer part is structured to compare the sensed voltage that corresponds to the terminal voltage of the battery with the corresponding voltage of discharge rate that corresponds to the discharge rate of the battery and to output a signal with the discharge time that corresponds to the discharge rate, so that the residual capacity can be indicated corresponding to the discharge rate.

Furthermore, the corresponding voltage of discharge rate is changed by differentially amplifying the timer output voltage that corresponds to the output signal of the timer part and the corresponding voltage of residual capacity that corresponds to the residual capacity of the battery, so that the residual capacity can be indicated corresponding to the changes of the discharge rate.

DETAILED DESCRIPTION OF PREFERRED EMBODIMENT

Figure 1:
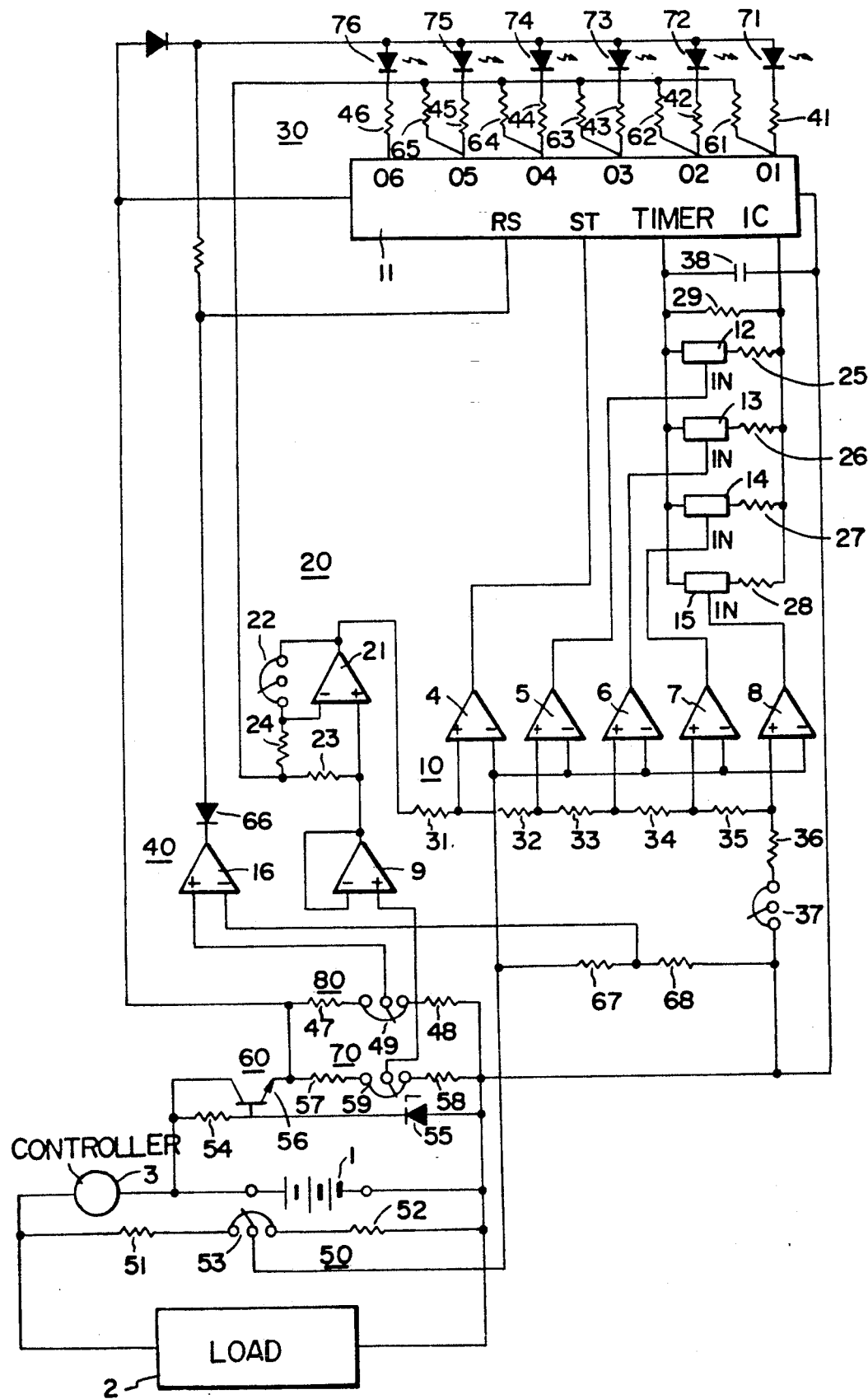
FIG. 1 is a circuit diagram of a charge indicator according to the present invention.

FIG. 1 is a circuit diagram of a charge indicator of a battery according to the present invention.

In the FIGURE, the reference numeral (1) denotes a battery, (2) a load, (3) a controller for controlling discharge of the battery 1 to the load 2.

A sensed voltage that corresponds to a terminal voltage of the battery 1 is obtained by inputting the terminal voltage to a voltage dividing circuit 50 composed of resistors 51 and 52 and a variable resistor 53 and dividing the terminal voltage only when the battery 1 is discharged through the controller 3.

A corresponding voltage of discharge rate that corresponds to a discharge rate of the battery 1 is obtained by regulating the voltage of the battery by the constant voltage circuit 60 composed of a resistor 54, a zener diode 55 and a transistor 56, and dividing the regulated voltage by a voltage dividing circuit 70 composed of resistors 57 and 58 and a variable resistor 59, and inputting the divided voltage through an operational amplifier 9 as a voltage follower i.e. a corresponding voltage of residual capacity, to a differential amplifier 21, and differentially amplifying the voltage and a timer output voltage of a timer part which is described later.

The sensed voltage is inputted to inverted input terminals of comparators 4, 5, 6, 7 and 8 in a pulse period setting part 10.

The corresponding voltage of residual capacity is inputted to a non-inverted input terminal of a differential amplifier 21 within a corresponding voltage of discharge rate varying part 20. A timer output voltage that corresponds to an output signal of the timer part 30 which will be described later, is inputted to the terminal through a resistor 23.

The timer output voltage that corresponds to the output signal of the timer part 30, is inputted to an inverted input terminal of the differential amplifer 21 through a resistor 24, and when the timer output voltage is 0 V, an output voltage of the differential amplifier 21, i.e. the corresponding voltage of discharge rate, sets to a corresponding voltage of full charge by adjusting a variable resistor 22.

The output voltage of the differential amplifier 21 is divided by resistors 31, 32, 33, 34, 35 and 36 and a variable resistor 37 and are inputted to non-inverted input terminals of the comparators 4, 5, 6, 7 and 8.

The output signal of the comparator 4 is inputted to a stop terminal (ST) of a timer IC 11 within the timer part 30. When H level signal is inputted to the stop terminal (ST), the timer IC 11 starts measuring of time, and when L level signal is inputted to the stop terminal (ST), the timer IC 11 stops measuring of time.

Output signals of the comparators 5, 6, 7 and 8 are inputted to input terminals (IN) of analog switching ICs 12, 13, 14 and 15. When H level signal is inputted to the input terminals (IN), the analog switching ICs 12, 13, 14 and 15 are switched on, and when L level signal is inputted to the input terminals (IN), the analog switching ICs 12, 13, 14 and 15 are switched off, and when H level signal is inputted, resistors 25, 26, 27 and 28 connected in series with each analog switching IC 12, 13, 14 and 15 are connected in parallel to a pulse period setting resistor 29 of the timer IC 11 and when L level signal is inputted, the resistors 25, 26, 27 and 28 are disconnected resistor 29. The reference numeral (38) indicates a capacitor for setting this pulse period.

The timer IC 11 is structured so that when H level signal is inputted to the stop terminal (ST), it starts measuring time by a pulse period determined by the capacitance of the pulse period setting capacitor 38 and the combined resistance of the pulse period setting resistor 29 and any of the resistor 25 to 28 currently connected to the resistor 29 in parallel and it generates H level output signals sequentially from an output 01 to an output 05 as a predetermined time passes by. The timer output voltage that corresponds to the output signals from the outputs 01 to 05 are inputted to the inverted input terminal of the differential amplifier 21 through resistors 61, 62, 63, 64 and 65 and the resistor 24 and to the non-inverted input terminal thereof through the resistors 61, 62, 63, 64 and 65 and the resistor 23. And the timer IC 11 is structure so that when the output of each output 01 to 05 becomes H level, it generates L level signal from an output 06.

The sensed voltage is also divided by resistors 67 and 68 and is inputted to an inverted input terminal of a comparator 16 within a reset part 40.

To a non-inverted input terminal of the comparator 16 a predetermined value obtained by regulating the voltage of the battery by the constant voltage circuit 60, and dividing the regulated voltage by a voltage dividing circuit 80 composed of resistors 47 and 48 and a variable resistor 49 is inputted. This predetermined value is an upper limited value for sending a reset signal to the timer IC 11.

An output signal of the comparator 16 is inputted to a reset terminal (RS) of the timer IC 11 in the timer part 30 through a diode 66. When L level signal is inputted to the reset terminal (RS), the timer IC 11 is reset, and when H level signal is inputted to the reset terminal (RS), the timer IC 11 starts counting operation. That is, when the timer IC 11 is reset, the timer output voltages of the outputs 01 to 05 of the timer IC 11 become 0 V.

Light emitting diodes 71, 72, 73, 74 and 75 are connected to each output 01 to 05 of the timer IC 11 through the resistors 41, 42, 43, 44 and 45 and they are sequentially turned off when H level signals are generated from the outputs 01 to 05. When H level signal is generated from the output 05, L level signal is generated from the output 06 and a light emitting diode 76 is lit up.

Next, operations of the charge indicator structured as described above will be explained.

When the battery 1 is connected as described above, the constant voltage circuit 60 is activated and power from the circuit is supplied to the comparators 4, 5, 6, 7, 8 and 16, the operational amplifier 9, the timer IC 11, the analog switching ICs 12, 13, 14 and 15 and the differential amplifier 21. The predetermined value for resetting the timer IC 11 is also given to the non-inverted input terminal of the comparator 16. When the power is supplied, the timer output voltage of the outputs 01 to 05 of the timer IC 11 becomes 0 V and the analog switching ICs 12, 13, 14 and 15 are all switched off. The constant voltage circuit 60 is activated by the battery 1.

The output voltage of the constant voltage circuit 60 is divided by the voltage dividing circuit 70 and is inputted to the non-inverted input terminal of the differential amplifier 21 as a corresponding voltage of residual capacity through the operational amplifier 9 as a voltage follower. The timer output voltage of the outputs 01 to 05 of the timer IC 11 is inputted to the inverted input terminal of the differential amplifier 21 through the resistor 24, and when it is 0 V, the variable resistor 22 is adjusted so that the output voltage of the differential amplifier 21, i.e. the corresponding voltage of discharge rate, becomes the corresponding voltage of full charge. This corresponding voltage of full charge is predetermined to 2.13 V per cell in a lead battery and to 1.32 V per cell in a nickel-cadmium battery.

On the other hand, the divided voltage from the voltage dividing circuit 50 divided by the resistors 67 and 68 is inputted to the inverted input terminal of the comparator 16 during discharge of the battery 1 and when this voltage is below the predetermined value from the voltage dividing circuit 80, the output of the comparator 16 becomes H level. Then H level signal is inputted to the reset terminal (RS) of the timer IC 11, thereby starting the counting operation. When the divided voltage is above the predetermined value, the output of the comparator 16 becomes L level, the timer IC 11 is reset and the timer output voltage of the outputs 01 to 05 becomes 0 V. This predetermined value is set to 2.40 V per cell in a lead battery and to 1.60 V per cell in a nickel-cadmium battery.

Accordingly, when the battery 1 is discharged and the timer IC 11 starts the counting operation, the voltage of the inverted input terminal of the comparator 4 becmes lower than that of the non-inverted input terminal in the beginning, so that the output of the comparator 4 becomes H level and this H level signal is inputted to the stop terminal (ST) of the timer IC 11, thereby starting the measuring of time. Since the outputs of the comparators 5, 6, 7 and 8 are L level, the analog switching ICs 12, 13, 14 and 15 are switched off and the measuring of time is carried out by a pulse period determined by the resistor 29 and the capacitor 38.

The time thus measured is proportional to the degree of the drop of the sensed voltage to the corresponding voltage of full charge, i.e. to the discharge rate, so that when the discharge is continued with this discharge rate, the timer IC 11 causes the output signals to be generated sequentially from the outputs 01 to 05, indication of residual capacity to be shifted from 100% to 0% as the light emitting diodes 71, 72, 73, 74 and 75 are turned off, and the light emitting diode 76 to be lit up when the residual capacity is indicated to be 0%. Accordingly, it allows the indication of residual capacity to be shifted from 100% to 0% by a discharge time equal to the discharge rate. It is also easy to adjust the light emitting diode 76 to light up when the indication of residual capacity is 20% to prevent over discharge of the battery.

Then, when the discharge rate increases during the discharge, the degree of the drop of the sensed voltage to the corresponding voltage of full charge increases, and the outputs of the comparators 5, 6, 7 and 8 become H level sequentially, the analog switching ICs 12, 13, 14 and 15 are switched on sequentially and the pulse period of the timer IC 11 for measuring the time is shortened.

That is, the time for generating the output signals sequentially from the outputs 01 to 05 of the timer IC 11 is shortened and the time for shifting the indication of the residual capacity from 100% to 0% is shortened.

Since the outputs 01 to 05 of the timer IC 11 are inputted to the inverted input terminal of the differential amplifier 21 through the resistors 61, 62, 63, 64 and 65 and the resistor 24 and to the non-inverted input terminal thereof through the resistors 61, 62, 63, 64 and 65 and the resistor 23, its output voltage is the corresponding voltage of discharge rate that corresponds to the discharge rate of the current from the corresponding voltage of full charge as the battery is started discharge, and the indication of the residual capacity changes due to the change of the discharge rate.

Next, a case when the discharge of the battery 1 is stopped by the controller 3 during operation of the charge indicator will be explained.

When the battery 1 is stopped discharging, its sensed voltage rises up and the outputs of the comparators 4, 5, 6, 7 and 8 turn to L level. At that time the timer IC 11 is stopped measuring of time, but the timer IC 11 is not reset unless the divided voltage divided by the resistors 67 and 68 rises up to the predetermined value divided by the resistors 47, 48, and variable resistor 49, so that the timer IC 11 may be held the state immediately before the battery 1 is stopped discharging.

Since the predetermined value is not influenced by the operation of the controller 3, the reset part 40 may be backed up by the battery 1 even if the battery 1 is stopped discharging by the controller 3.

When the battery 1 is replaced, all the voltages including the predetermined value become 0 V, so that the timer IC 11 is reset when a new battery is connected.

As described above, the charge indicator of the present invention can accurately indicate residual capacity of a battery corresponding to changes of discharge rate thereof and even when it is stopped during discharge, it can hold a state immediately before battery is stopped discharging, so that it is useful as a charge indicator of a battery used for electric vehicles and for electronic devices.

What is claimed is:

1. A charge indicator for a battery structured to indicate a residual capacity corresponding to a discharge rate of said battery, comprising:

pulse period setting means for comparing a sensed voltage that corresponds to a terminal voltage of said battery with a voltage that corresponds to a discharge rate of said battery and for outputting a pulse period varying signal;

a pulse period means responsive to said pulse period varying signal that changes a pulse period in discrete levels corresponding to the discharge rate of the battery and outputting an output signal consisting of capacitor discharge pulses with a discharge time that corresponds to said battery discharge rate, a timer means including a timer IC responsive to said pulses with an output voltage which changes in a stepwise manner corresponding to said residual capacity;

varying means for differentially amplifying the timer output voltage and a corresponding voltage of residual capacity that corresponds to a residual capacity of said battery to change the discharge rate voltage corresponding to said discharge rate of said battery; and reset means for sending out a reset signal to said timer means to reset said discharge rate voltage to a voltage corresponding to full charge when said sensed voltage exceeds a predetermined value.

2. The charge indicator of a battery according to claim 1, wherein said battery is the power source of said timer means and said reset means.

* * * * *